United States Patent [19]

Juhasz et al.

[11] Patent Number: 5,541,951
[45] Date of Patent: Jul. 30, 1996

[54] DEVICE AND METHOD FOR HIGH-POWER END PUMPING

[75] Inventors: Tibor Juhasz, Irvine; Laszlo Turi, San Diego, both of Calif.

[73] Assignee: Intelligent Surgical Lasers, Inc., San Diego, Calif.

[21] Appl. No.: 337,872

[22] Filed: Nov. 14, 1994

[51] Int. Cl.$^6$ ............................................. H01S 3/08
[52] U.S. Cl. ................................................. 372/101
[58] Field of Search ...................................... 372/101, 71

[56] References Cited

U.S. PATENT DOCUMENTS

| | | |
|---|---|---|
| 4,006,990 | 2/1977 | Munk . |
| 4,185,891 | 1/1980 | Kaestner ................................. 372/101 |
| 4,439,861 | 3/1984 | Bradford . |
| 4,554,666 | 11/1985 | Altman . |
| 4,713,822 | 12/1987 | Lee . |
| 4,791,631 | 12/1988 | Baumert et al. . |
| 5,027,359 | 6/1991 | Leger et al. ............................ 372/101 |
| 5,062,702 | 11/1991 | Bille . |
| 5,073,041 | 12/1991 | Rastani ................................. 372/101 |
| 5,181,224 | 1/1993 | Snyder ................................. 372/101 |
| 5,185,758 | 2/1993 | Fan et al. ............................. 372/101 |
| 5,212,707 | 5/1993 | Heidel et al. ......................... 372/101 |
| 5,268,920 | 12/1993 | Esterowitz et al. .................... 372/101 |
| 5,369,661 | 11/1994 | Yamaguchi et al. ................... 372/101 |

*Primary Examiner*—Rodney B. Bovernick
*Assistant Examiner*—Robert E. Wise
*Attorney, Agent, or Firm*—Nydegger & Associates

[57] ABSTRACT

A high power end-pumped laser system for use with a regenerative amplifier includes an assembly for generating a plurality of collimated laser beams and a focusing element for focusing the plurality of laser beams onto a common focal volume. To generate the plurality of collimated laser beams, the assembly employs an array of diode lasers and an array of collimating microlenses. The microlens array is positioned relative to the laser diode array to place each collimating microlens in the beam path of a respective diode laser. The resultant plurality of collimated laser beams are emitted from the assembly substantially parallel to each other and they are all then passed through a cylindrical collimating lens with the result that the beams are collimated in two planes. The output of the cylindrical collimating lens is then focused by a lens to a focal volume. For operation of the system, the focal volume is located in a laser medium to allow the medium to be end-pumped. To prevent thermal instability in the medium, and to maximize the efficiency of the pumping action, the plurality of laser diodes are simultaneously pulse activated for only approximately four hundred microseconds during each millisecond of operation (400 μs/ms).

19 Claims, 1 Drawing Sheet

Time (milliseconds)

DEVICE AND METHOD FOR HIGH-POWER END PUMPING

FIELD OF INVENTION

The present invention pertains generally to systems for pumping laser media which are used with regenerative amplifiers. More particularly, the present invention pertains to a system which allows a laser medium to be end-pumped by an array of semi-conductor laser diodes without excessive thermal lensing. The present invention is particularly, but not exclusively useful for producing a high-power, high-efficiency neodymium laser with excellent beam quality.

BACKGROUND OF THE INVENTION

Solid-state lasers, and particularly neodymium lasers, have come to be widely used in diverse fields for numerous applications. The popularity of neodymium lasers stems largely from their versatility and simplicity. Consequently, a vast array of differing types are now commercially available.

All regenerative amplifiers generally include a laser medium which is fabricated from glass or a crystalline material such as yttrium lithium fluoride (YLF) or yttrium aluminum garnet (YAG). Included in the laser medium is a small percentage of neodymium ions which may be excited to create an electron inversion within the laser medium. Once the inversion exists, the laser medium acts as a photon amplifier, emitting a number of new photons in proportion to the number of photons absorbed. With this mechanism, regenerative amplifiers generate a stream of photons that are emitted as an amplified laser output beam.

Operation of a neodymium based regenerative amplifier requires that the neodymium ions within the laser medium be excited or caused to adopt an energy level which is greater than the ground level of the ions. This process is known as pumping, and many different techniques and methodologies exist for pumping neodymium based lasers. For instance, it is possible to pump a neodymium laser medium using broad-spectrum light sources or continuous tungsten arc lamps. In practice, however, the use of pumping devices of these types suffers from limited efficiency as a result of the inability of the neodymium ions to absorb the full spectrum of radiation emitted by the light source or lamp.

In a similar fashion, flashlamps of various types have been employed to pump neodymium lasers. Flashlamps produce large quantities of emitted radiation allowing high-power neodymium lasers to be developed. Like other broad-spectrum sources, however, the use of flashlamps generally results in low laser efficiency since much of the spectrum produced by the flashlamp cannot be absorbed by the neodymium ions.

A more efficient approach has been to pump the regenerative amplifier with a second laser source such as, for example, a gallium-arsenide semi-conductor based laser diode. Pumping with a laser diode allows the output spectrum of the pump to be matched with the frequencies most easily absorbed by the neodymium ions in the laser medium. In this way, the inefficiency inherent in the use of broad-spectrum pumping devices is avoided. Limited power outputs associated with semi-conductor laser diodes have, however, complicated development of high-power, semi-conductor pumped neodymium lasers.

Several techniques have been employed to increase the power output of semi-conductor pumped neodymium lasers. The most important technique is embodied in designs where a number of semi-conductor laser diodes are simultaneously employed to pump a single laser medium. By combining the output of a group of semi-conductor lasers, the overall power output achieved by the laser medium may be increased, and in some cases power outputs equivalent to flashlamp pumped units have been achieved.

Typically, most neodymium lasers which employ a number of semi-conductor lasers for pumping have been of the side-pumping variety. Laser designs of this type feature a number of semi-conductor laser diodes aligned alongside a rod-shaped laser medium. The beams from the diodes are aimed to pass through the side of the rod and excite the neodymium within the medium. In practice, laser designs of this type suffer from several disadvantages including high levels of noise in the generated laser output and low efficiency. Additionally, laser designs of this type are also often characterized by a phenomena known as beam pointing instability caused by variations in the beam path within the laser cavity.

To surmount the difficulties associated with side-pumped designs, end-pumped neodymium laser designed have been developed. Lasers of this type deploy a laser diode or a group of laser diodes at the end of a rod-shaped laser medium. The beams from the diodes are focused to pass through the end of the rod and excite the neodymium within the medium. Unlike side-pumped designs, however, the pumping beams on end-pumped lasers are aligned to be substantially colinear to the fundamental laser mode. Generally, end-pumped laser designs avoid the noise, inefficiency and beam pointing instability common to side-pumped lasers. In practice, however, there has been substantial difficulty involved in focusing large numbers of semi-conductor lasers to effectively end-pump a single laser rod. As a result, end-pumped laser designs often have limited power outputs. Additionally, the small focusing area produced by end-pumped designs often creates thermal inefficiency within the pumping system and degraded quality of the laser output beam due to the effects of thermal lensing.

In light of the above it is an object of the present invention to provide a system for pumping a laser medium which can be used to produce a highly efficient and relatively powerful neodymium laser. Another object of the present invention is to provide a regenerative amplifier which exhibits a relatively high power and low noise output. Another object of the present invention is to provide a system for pumping a laser medium which may be used to produce a neodymium laser producing a low noise output which is relatively free from beam pointing instability. Still another object of the present invention is to provide a system for pumping a laser medium which avoids the effects of thermal lensing in the pumped laser medium. Yet another object of the present invention is to provide a system for pumping a laser medium which is simple to operate, is relatively easy to manufacture, and which is comparatively cost effective.

SUMMARY OF THE PREFERRED EMBODIMENTS

The present invention is a system for end-pumping a laser medium. In general terms, the goal of the present invention is to efficiently transfer energy produced by an array of semi-conductor laser diodes into a neodymium doped yttrium lithium fluoride rod thereby allowing the rod to be used as a regenerative photon amplifier.

Structurally, the present invention includes an array of semi-conductor diode lasers. The laser array consists of twelve stripes, each consisting of one or more laser diodes. An array of twelve cylindrical microlenses is placed over the laser diode array with an individual microlens positioned over each diode stripe. A cylindrical collimating lens is placed over the array of microlenses and a focusing lens is placed over the cylindrical lens.

In operation, laser output from the diode stripes passes through the microlens array effectively collimating the output from each diode stripe in the plain of slow divergence. At this point, the laser light in the pumping system consists of twelve collimated beams, each oriented in parallel. The twelve beams then pass through the cylindrical lens which collimate the laser light in the plain of the fast divergence. As a result, the laser light leaving the cylindrical lens is collimated in two planes. The laser light then passes through the focusing lens where the twelve collimated beams are projected and focused into a focal volume shaped substantially as a hyperboloid of one sheet. Spatially, the entire pumping apparatus is positioned at one end of a neodymium doped yttrium lithium fluoride rod to project the focal volume through the end of the rod and into the media within.

Experience has proven that continuous pumping of a Nd:YLF regenerative amplifier is both inefficient and harmful to the quality of the amplifier output. In more detail, the pumping system of the present invention is used to focus energy and create an electron inversion within a Nd:YLF rod. The inversion created by the pumping system is temporary, however, and lasts approximately 400 μs. Therefore, it may be appreciated that pumping energy applied more than approximately 400 μs will be lost through spontaneous decay. Additionally, pumping of the Nd:YLF rod after the electron inversion is established generally results in an increase in thermal energy within the rod. The presence of the thermal energy distorts the rod and degrades the quality of the amplifier's output.

To avoid the inefficiency and thermal lensing problems associated with continuous pumping of the regenerative amplifier, a control system is included that allows the output of the pumping system to be selectively enabled and disabled. Importantly, the control system allows the beam produced by the pumping system to be turned on approximately 400 μs before the regenerative amplifier is fired thereby assuring that the required electron inversion will exist and that thermal distortion of the Nd:YLF rod will be minimized.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts.

DESCRIPTION OF THE PREFERRED EMBODIMENTS

Figure 1:
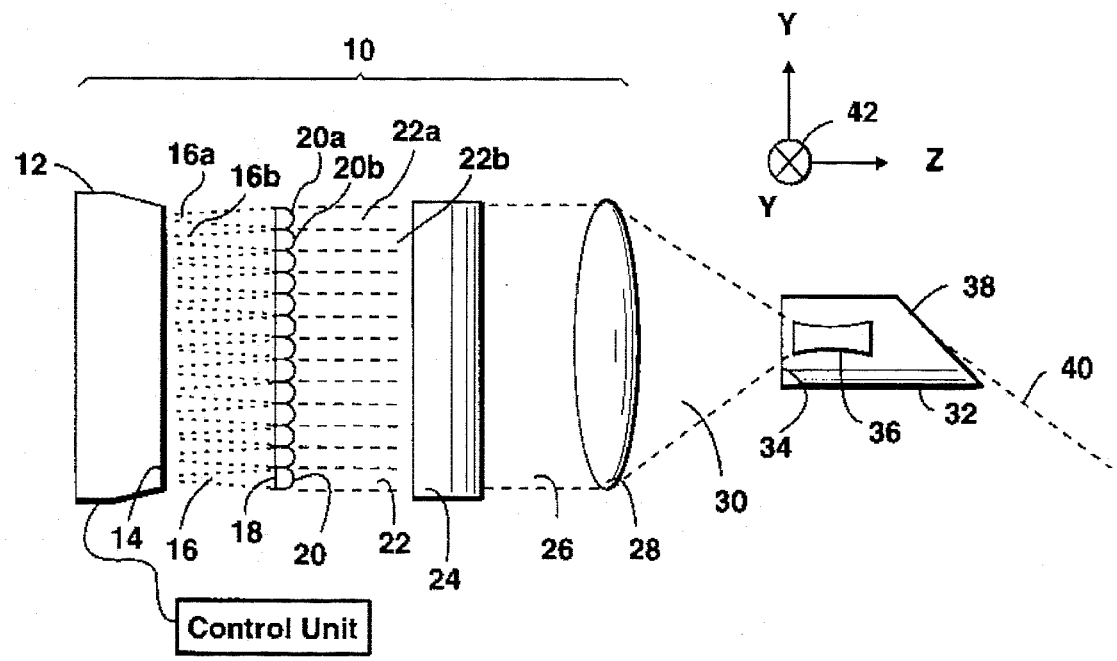
FIG. 1 is a schematic of the pumping system of the present system shown operationally attached to a rod-shaped laser crystal.

The structural details of the present invention may be best appreciated by reference to FIG. 1. In that figure, it can be seen that the laser pumping system of the present invention is shown and generally designated 10. In more detail, the laser pumping system 10 includes a laser diode array 12 comprised of a series of semi-conductor lasers elements 14. Although many different types of laser diodes may be used in laser diode array 12, the particular embodiment shown features twelve laser diode stripes which are each approximately 200 μm long as the laser diode elements 14. For demonstration purposes, the laser beams that form the output of the laser diode array 12 are shown and designated 16. The beams 16a and 16b are only exemplary.

Adjacent to the laser diode array 12 (and to the right of laser diode array 12 in FIG. 1), a collimating microlens array 18 is shown. The collimating microlens array 18 is composed of a series of individual collimating microlenses 20, the microlenses 20a and 20b are exemplary. For the array 18, each microlens 20 is positioned to intercept an individual beam 16 produced by the laser diode array 12. For the purposes of the present invention, the number of collimating microlenses 20 is matched to the number of laser diode elements 14 in the laser diode array 12. Structurally, and only by way of example, each collimating microlens 20 features a cylindrical shape and a three millimeter (3 mm) focal length. The series of beams emitted by the collimating microlens array 18 are shown and designated 22. Again, the beams 22a and 22b are exemplary Laser pumping system 10 also includes a cylindrical collimating lens 24 positioned adjacent to collimating microlens array 18 (to the right of collimating microlens array 18 in FIG. 1). For the example given here, the cylindrical collimating lens 24 has a focal length of ten millimeters (10 mm) and is positioned coaxially with the center of collimating microlens array 18 and laser diode array 12. For purposes of demonstration, the output of cylindrical collimating lens 24 is designated 26 in FIG. 1.

The final element in the laser pumping system 10 of the present invention is the focusing lens 28, Focusing lens 28 is shown to the right of cylindrical collimating lens 20 in FIG. 1. For the purposes of the example given here for the present invention, focusing lens 28 is fabricated with a double convex shape and utilizes a twenty millimeter focal length (20 mm). Like the cylindrical collimating lens 24, the focusing lens 28 is positioned coaxially with the center of collimating microlens array 18 and laser diode array 12. The output of focusing lens 28, which forms the output of pumping system 10 is shown and designated 30.

Laser pumping system 10 is designed to be used in conjunction with a solid-state laser medium. A medium of this type is shown in FIG. 1 and is designated 32. For the purposes of the present invention, laser medium 32 is preferably a cylindrical rod fabricated from neodymium doped yttrium lithium fluoride (Nd:YLF). The laser medium 32 includes a rear window 34 through which the focusing lens output 30 may be passed. This allows the focal volume 36 of the focusing lens output 30 to be located within the laser medium 32. Additionally, laser medium 32 includes an output window 38 and, when used in combination with laser pumping apparatus 10 may produce a laser beam output 40.

OPERATION

Operation of laser pumping system 10 begins with the laser output 16 of laser diode array 12. As shown in FIG. 1, laser diode array output 16 passes through collimating microlens array 18. The effect of the collimating microlens array 18 is to perform a first collimation operation, leaving the collimating microlens array output 22 substantially collimated in the XZ plane. (A set of axis useful for distinguishing the various planes of differentiation is included in FIG. 1 and designated 42).

The collimating microlens array output 22 passes through cylindrical collimating lens 24 where a second collimation operation is performed. As a result of the second collimation operation, the cylindrical collimating lens output 26 is collimated in the YZ plane. The doubly collimated cylindrical collimating lens output 26 then passes through the focusing lens 28 where it is projected and focused into a focal volume 36.

Figure 2:
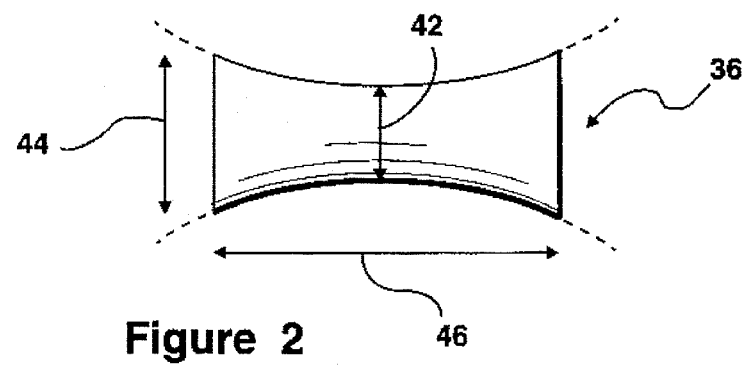
FIG. 2 is a side elevational view showing the ellipsoidal configuration of the output of the pumping system of the present invention.

The focal volume 36, shown in greater detail in FIG. 2, is substantially shaped as a hyperboloid of one sheet. For the purposes of the present invention, the focal volume is defined by a minimum diameter 42. The maximum diameter 44 is then defined as $\sqrt{2}$ times the minimum diameter 42 and the overall length 46 is chosen as two times the distance between the minimum diameter 42 and the maximum diameter 44. Importantly, for optimal pumping efficiency, the entire focal volume 36 defined by the minimum diameter 42, maximum diameter 44 and overall length 46 must be positioned internally to laser medium 32.

It may be appreciated that the effect of pumping apparatus 10 is to focus and concentrate the photons generated by laser diode array 12 and to project those photons into laser medium 32 where a resulting electron inversion is created. It may also be appreciated that the resulting electron inversion enables the generation of laser output beam 38. To enhance the effectiveness of pumping system 10, focusing lens output 30 is preferably wavelength matched to the type of material used in laser medium 32. In the case of the embodiment shown, the focusing lens output is preferably tuned to match the 798 nm absorption peak of the Nd:YLF crystal comprising the laser medium 32. Tuning of this nature may be performed with a thermoelectric cooler applied to laser diode array 12 (not shown).

In general, laser pumping system 10 may be used to apply a continuous stream of photons to laser medium 32. Alternatively, laser pumping system 10 may be used to create the required photon inversion only when actual operation of the laser medium 32 requires existence of the electron inversion. Operation in the alternative mode is known as quasi continuous-wave pumping and has been found to be preferable over continuous mode pumping.

Figure 3:
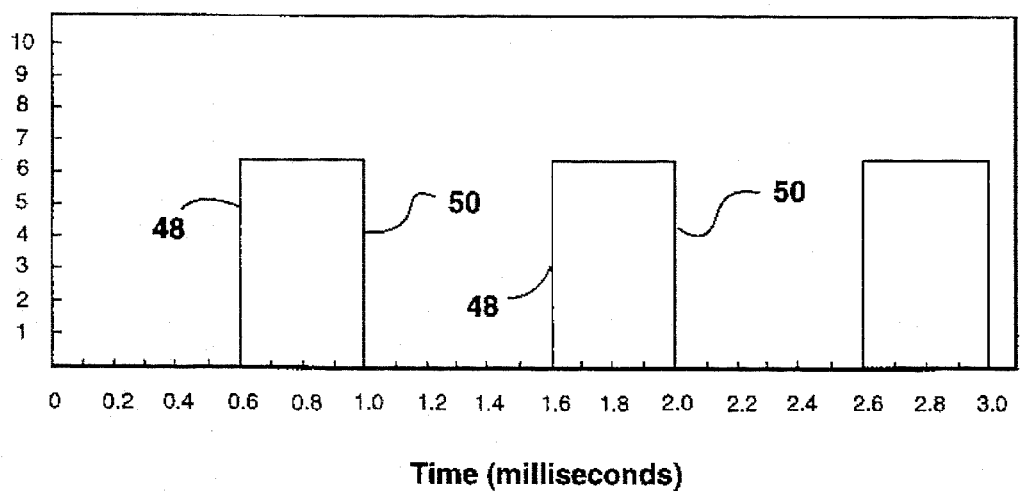
FIG. 3 is a graph showing an idealized output of the pumping system of the present invention plotted as a function of time.

Use of the laser pumping system 10 in a quasi continuous-wave mode requires the inclusion of a system whereby the output of the laser diode array 12 may be selectively enabled and disabled. Use of this system is shown in FIG. 3. In FIG. 3, it is assumed that the laser medium will be fired at a rate of 1 kHz, or once every millisecond. To create the required electron inversion, the laser pumping system 10 is also activated once every millisecond but activation is limited to the last 400 microseconds of each one millisecond period.

Use of the laser pumping system 10 in quasi-continuous mode operation as shown in FIG. 3 has several advantages. One of those advantages is reduced power consumption. As easily appreciated from FIG. 3, quasi-continuous mode operation reduces the amount of time that laser pumping system 10 is activated thereby reducing power consumed by laser pumping system 10. Additionally, in cases where a Nd:YLF crystal is used for laser medium 32, application of laser pumping system 10 for more than 400 microseconds produces no further increase in electron inversion within laser medium 32 but does result in an undesirable increase in thermal energy imparted to laser medium 32. Unwanted thermal energy within laser medium causes distortion of the Nd:YLF crystal with a resulting degradation of the laser beam output 40. This phenomena, known as thermal lensing, may be substantially alleviated by use of the quasi continuous-wave pumping technique shown in FIG. 3.

While the particular laser pumping system as herein shown and disclosed in detail is fully capable of obtaining the objects and providing the advantages herein before stated, it is to be understood that they are merely illustrative of the presently preferred embodiments of the invention and that no limitations are intended to the details of construction or design herein shown other than as described in the appended claims.

We claim:

1. A system for pumping a laser medium which comprises:

a plurality of laser diodes for generating a plurality of laser beams directed along substantially parallel paths;

a plurality of cylindrically shaped collimating microlenses, each said microlens being positioned on a respective said laser beam path from one said laser diode for individually collimating said laser beam in a first plane of divergence;

a cylindrically shaped lens for collimating said plurality of first plane of divergence collimated laser beams in a second plane of divergence; and a lens for focusing said plurality of collimated laser beams into a focal volume in said laser medium.

2. A system as recited in claim 1 wherein said laser medium is in a regenerative amplifier.

3. A system as recited in claim 1 further comprising means for selectively switching said laser diodes between a disabled state and an enabled state for generation of said plurality of laser beams.

4. A system as recited in claim 3 wherein said enabled state has a duration of approximately 400 microseconds (400 µs).

5. A system as recited in claim 4 wherein said laser diodes are switched from said disabled state to said enabled state approximately once every millisecond (1/ms).

6. A system as recited in claim 1 wherein said focal volume is substantially hyperboloidal in shape.

7. A system for pumping a laser medium which comprises:

a generator for generating a plurality of laser beams, each said laser beam being directed along a path, substantially parallel to other said paths;

a plurality of cylindrically shaped collimating microlenses for individually collimating said laser beams in a first plane of divergence;

a cylindrically shaped lens for collectively collimating said laser beams in a second plane of divergence; and a lens for focusing said plurality of collimated laser beams into a focal volume in said laser medium.

8. A system as recited in claim 7 wherein said laser medium is part of a regenerative amplifier.

9. A system as recited in claim 7 wherein said means for generating a plurality of laser beams comprises a plurality of laser diodes.

10. A system as recited in claim 9 wherein said plurality of laser diodes may be repetitively switched between a disabled state and a enabled state.

11. A method as recited in claim 10 wherein said laser diodes are switched from said disabled state to said enabled state approximately once every millisecond (1/ms).

12. A system as recited in claim 11 wherein said enabled state has a duration of approximately 400 microseconds (400 µs).

13. A system as recited in claim 7 wherein said means for focusing said plurality of collimated laser beams comprises a double convex lens.

14. A method for pumping a laser medium in a regenerative amplifier which comprises:

generating a plurality of laser beams;

projecting each said laser beam through a cylindrically shaped microlens for collimating said plurality of laser beams in a first plane of divergence;

projecting said first plane of divergence collimated laser beams through a cylindrically shaped lens for collimating said plurality of laser beams in a second plane of divergence; and focusing said laser beams into a focal volume within said laser medium.

15. A method as recited in claim 14 wherein said focal volume is substantially hyperboloidal in shape.

16. A method as recited in claim 14 wherein said generating step has a duration of approximately 400 microseconds (400 µs).

17. A method as recited in claim 16 wherein said generating step is repeated approximately once every millisecond (1/ms).

18. A system for pumping a laser medium which comprises:

means for generating a plurality of laser beams, each said laser beam being directed along a path, substantially parallel to other said paths;

an array of cylindrically shaped microlenses, one said microlens positioned in said path of each respective said laser beam, said array of cylindrically shaped microlenses individually collimating said laser beams in a first plane of divergence;

means for collectively collimating said laser beams in a second plane of divergence; and means for focusing said plurality of collimated laser beams into a focal volume in said laser medium.

19. A system for pumping a laser medium which comprises:

means for generating a plurality of laser beams, each said laser beam being directed along a path, substantially parallel to other skid paths;

means for individually collimating said laser beams in a first plane of divergence;

a cylindrically shaped collimating lens for collectively collimating said laser beams in a second plane of divergence; and means for focusing said plurality of collimated laser beams into a focal volume in said laser medium.

\* \* \* \* \*